(12) United States Patent
Wang et al.

(10) Patent No.: US 8,697,316 B2
(45) Date of Patent: Apr. 15, 2014

(54) HARD MASK SPACER STRUCTURE AND FABRICATION METHOD THEREOF

(75) Inventors: Ya-Chih Wang, New Taipei (TW); Hai-Han Hung, Taoyuan County (TW); Wen-Chieh Wang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 18 days.

(21) Appl. No.: 13/492,934

(22) Filed: Jun. 11, 2012

(65) Prior Publication Data

US 2013/0330660 A1 Dec. 12, 2013

(51) Int. Cl.
*G03F 1/38* (2012.01)

(52) U.S. Cl.
USPC ............................................................ 430/5

(58) Field of Classification Search
USPC ............................................................ 430/5
See application file for complete search history.

(56) References Cited

U.S. PATENT DOCUMENTS

2010/0055621 A1\* 3/2010 Hatakeyama et al. ........ 430/323

\* cited by examiner

*Primary Examiner* — Christopher Young
(74) *Attorney, Agent, or Firm* — Winston Hsu; Scott Margo (57) ABSTRACT

A hard mask spacer structure includes a first spacer on a device layer, the first spacer defining a plurality of hole patterns and at least an asteriated hole pattern between the hole patterns; and a second spacer on the first spacer and inlaid into the asteriated hole pattern, thereby rounding the asteriated hole pattern.

7 Claims, 9 Drawing Sheets

HARD MASK SPACER STRUCTURE AND FABRICATION METHOD THEREOF

BACKGROUND OF THE INVENTION

1. Field of the Invention

The present invention relates generally to semiconductor technology and, more particularly, to self-aligned contact hole patterning and a hard mask spacer structure used during the self-aligned contact hole patterning.

2. Description of the Prior Art

As the pattern density increases and the feature size during printing of DRAM arrays becomes continuously smaller, the dimension of a contact hole or plug connecting component-to-component or layer-to-layer as well as the alignment margin for the device shrink.

In order to reduce the size of a contact hole formed through a photolithography process and to increase the alignment exactitude, a self-aligned contact is used. The self-aligned contact process may increase the alignment margin and reduce the contact resistance.

However, the prior art self-aligned method for patterning densely packed contact holes has shortcomings. For example, different contact hole profiles may occur, which may result in critical dimension (CD) control issue.

SUMMARY OF THE INVENTION

In one aspect, the present invention provides a hard mask spacer structure. The hard mask spacer structure includes a first spacer on a device layer, the first spacer defining a plurality of hole patterns and at least an asteriated hole pattern between the hole patterns; and a second spacer on the first spacer and inlaid into the asteriated hole pattern, thereby rounding the asteriated hole pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Figure 1:
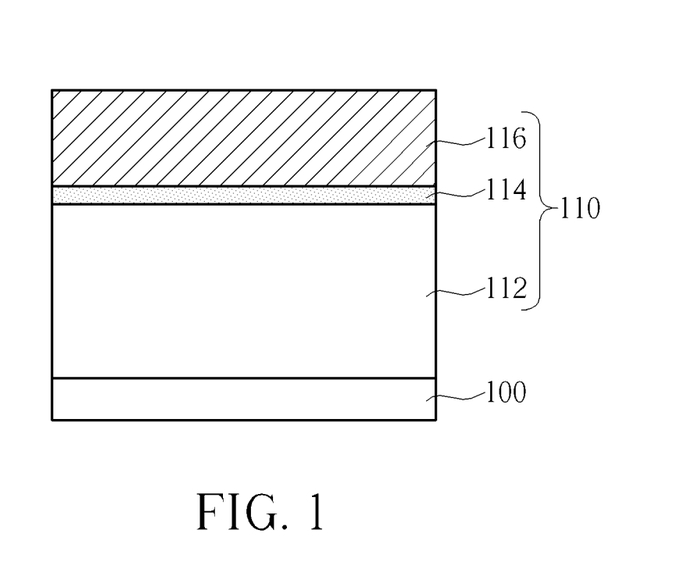
FIGS. 1-7 are schematic, cross-sectional diagrams showing a self-aligned method for patterning densely packed contact holes in a DRAM array in accordance with one embodiment of this invention.
Figure 2:
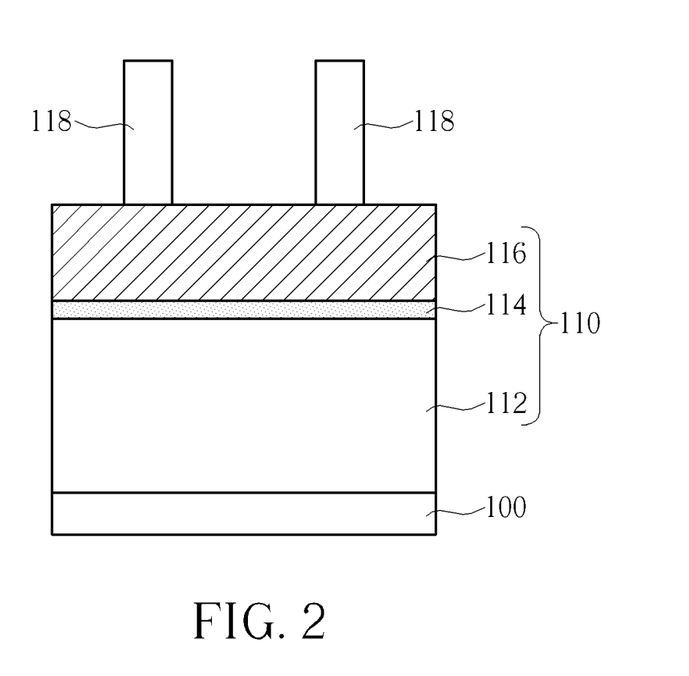

FIGS. 1-7 are schematic, cross-sectional diagrams showing a self-aligned method for patterning densely packed contact holes in a DRAM array in accordance with one embodiment of this invention. As shown in FIG. 1, a film stack 110 comprising, for example, a carbon layer 112, a dielectric anti-reflection coating (DARC) layer 114, and a hard mask layer 116, is formed on a substrate 100. The substrate 100 may be a device layer or a semiconductor substrate such as a silicon substrate or the like. According to the embodiment, the carbon layer 112 may be an amorphous carbon layer or any advanced patterning film. The DRAC layer 114 may be a silicon oxy-nitride or any suitable material layer. The hard mask layer 116 may comprise polysilicon or silicon nitride, but not limited thereto. As shown in FIG. 2, a plurality of photoresist pillars 118 with a pitch of, for example, 120 nm, are formed on the hard mask layer 116.

Figure 3:
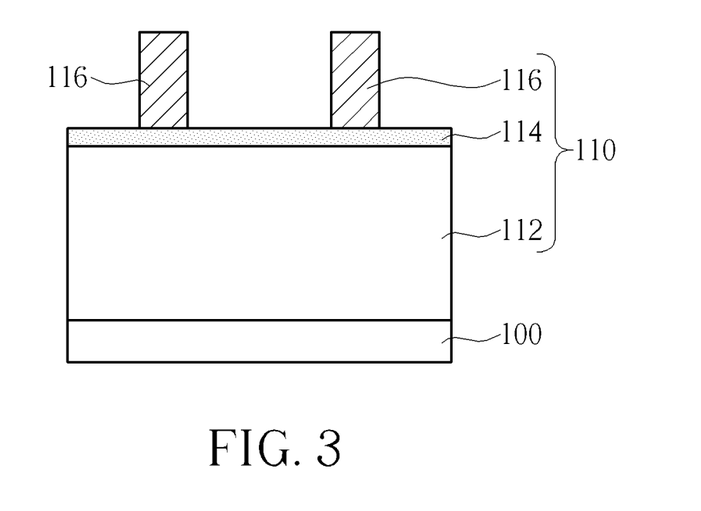
Figure 7:
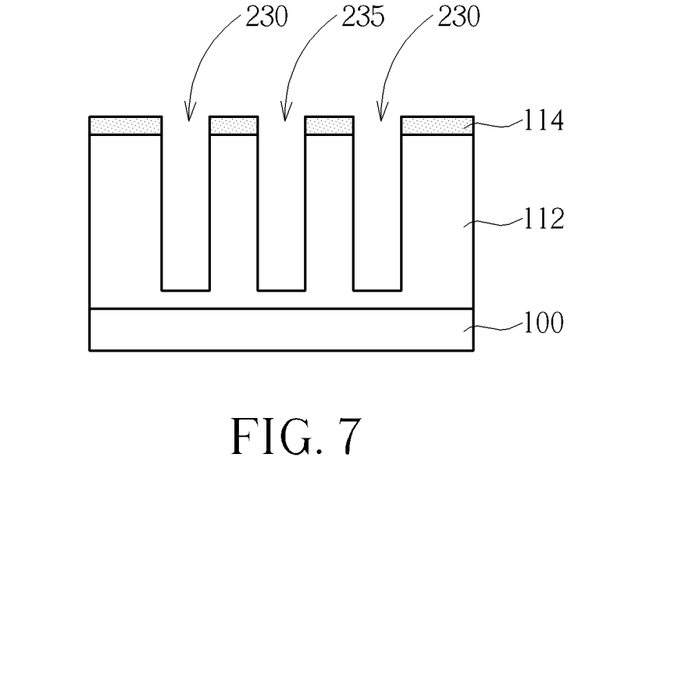

As shown in FIG. 3, a dry etching process is then carried out to etch the hard mask layer 116 that is not covered by the photoresist pillars 118 to thereby form a plurality of hard mask pillars 116. Thereafter, the photoresist pillars 118 are stripped. FIG. 7 shows the top view of the hard mask pillars 116 and the exposed DARC layer 114. For the sake of simplicity, only four hard mask pillars 116 are shown. It is to be understood that in other embodiments, the steps shown in FIG. 1 and FIG. 2 may be skipped, and the hard mask pillars 116 may be replaced with photoresist pillars.

Figure 4:
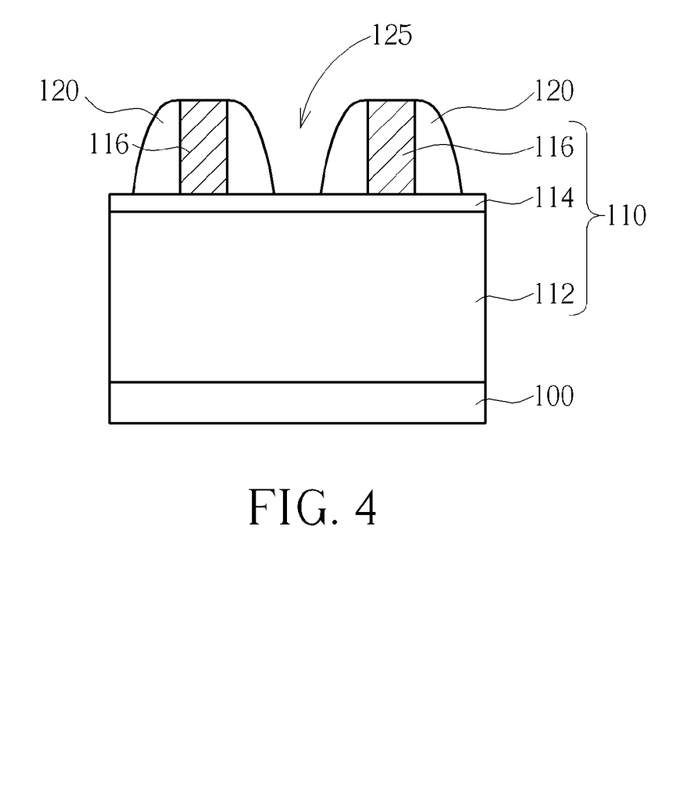
Figure 8:
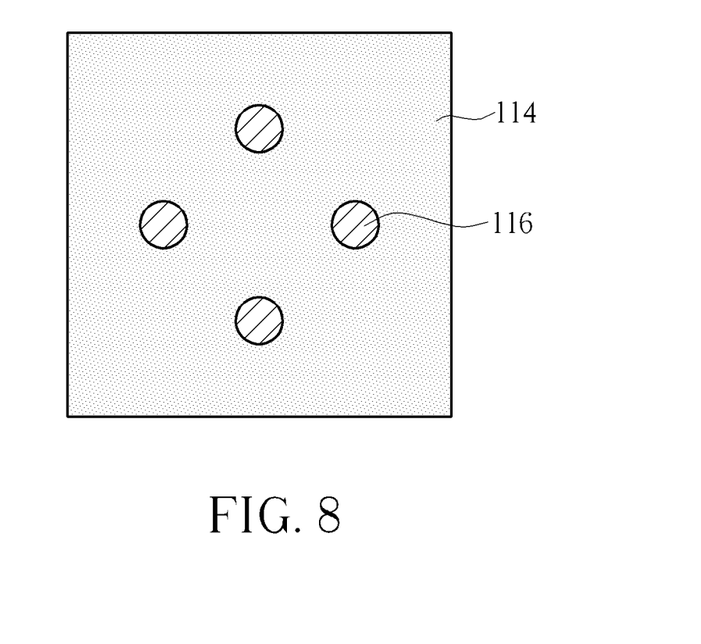
FIGS. 8-12 are top views of the elements shown in FIGS. 3-7.

As shown in FIG. 4, after the formation of the hard mask pillars 116, an annual spacer (first spacer) 120 is formed around each of the hard mask pillars 116. To form the spacer 120, first, a layer of spacer material such as silicon oxide may be deposited in a blanket fashion. The layer of spacer material may be deposited by using atomic layer deposition (ALD) methods. After deposition, the layer of spacer material is etched by performing an anisotropic dry etching process, thereby revealing the top surface of each of the hard mask pillars 116. FIG. 8 shows the top view of the annual spacers 120 and the hard mask pillars 116. The contiguous spacers 120 between four adjacent hard mask pillars 116 define a hole pattern 125 with an asteriated shape when viewed from above.

Figure 5:
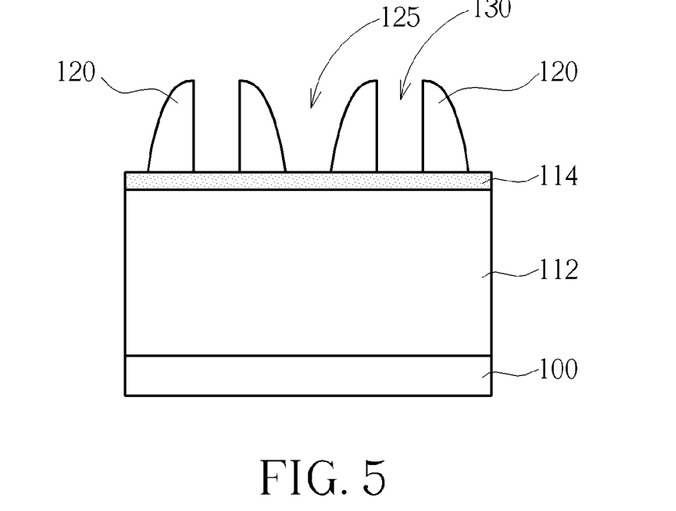
Figure 9:
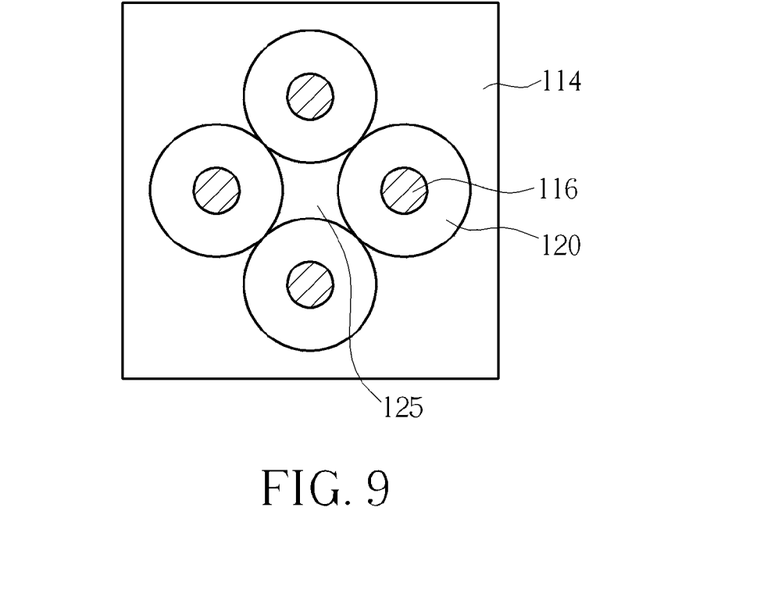

As shown in FIG. 5, after the formation of the spacers 120, the hard mask pillars 116 are selectively removed to form hole pattern 130. FIG. 9 shows that the critical dimension (CD) of each of the hole patterns 130 is slightly different from that of the hole pattern 125 surrounded by the hole patterns 130. As previously mentioned, the hole pattern 125 has substantially an asteriated shape or star shape when viewed from above, while the surrounding hole patterns 130 have a profile that is rounder and smoother. This causes a CD control problem.

Figure 6:
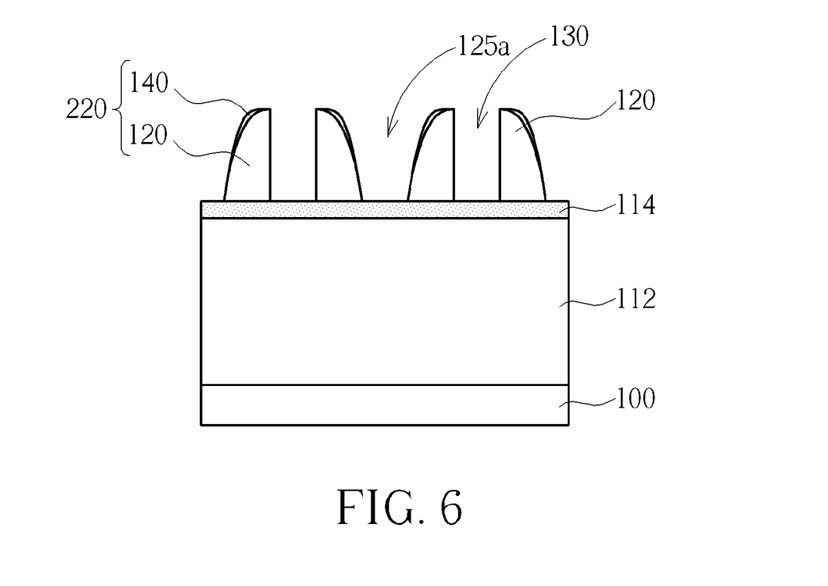
Figure 10:
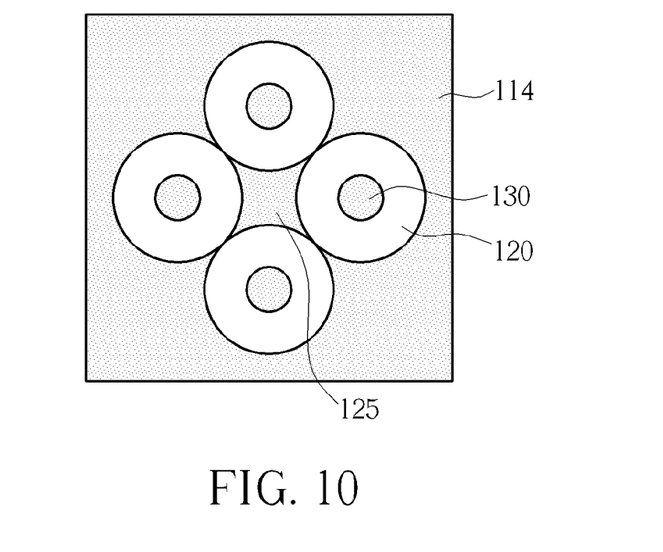
Figure 11:
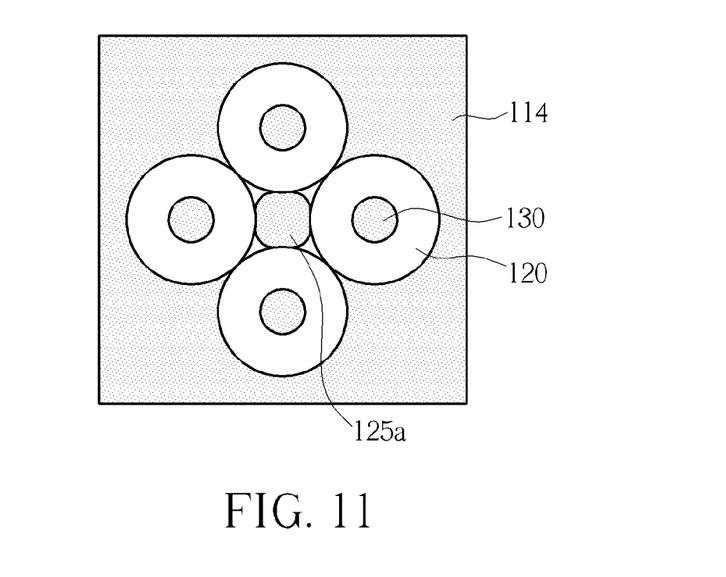
Figure 12:
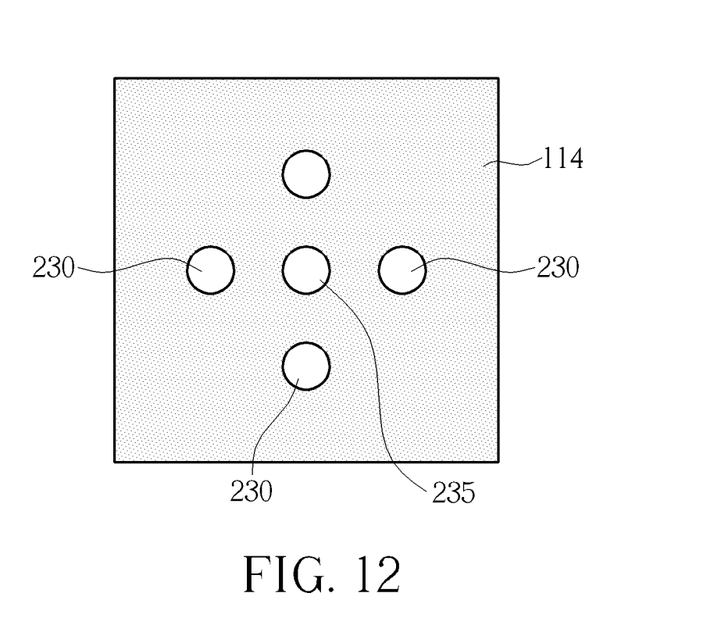

As shown in FIG. 6, a second ALD process is carried out to deposit a conformal thin oxide layer (not shown) on the spacers 120 and on the DARC layer 114. The conformal thin oxide layer doest not fill the hole patterns 125 and 130. An anisotropic dry etching process is then performed to etch the conformal thin oxide layer. As shown in FIG. 10, by performing the second ALD and etching, the hole pattern 125 becomes rounder and smoother. After the second ALD and etching, a small part of the conformal thin oxide layer (second spacer) 140 may remain on the spacer 120, which constitute a spacer pattern 220. A small part of the conformal thin oxide layer 140 may be inlaid into the hole pattern 125 thereby forming a rounded hole pattern 125a.

As shown in FIG. 7, using the spacer pattern 220 as an etch hard mask, an anisotropic dry etching is performed to etch the DARC layer 114 and the carbon layer 112, thereby transferring the hole patterns 130 and 125a into the carbon layer 112. After removing the spacer pattern 220, a hole pattern 230 corresponding to the hole pattern 130 and a hole pattern 250 corresponding to the hole pattern 125a are formed.

Figure 13:
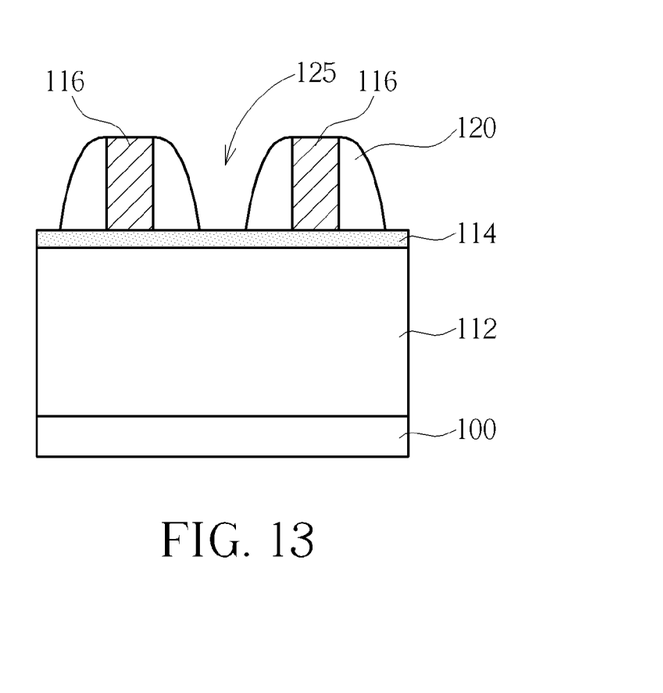
FIGS. 13-15 are schematic, cross-sectional diagrams showing a self-aligned method for patterning densely packed contact holes in a DRAM array in accordance with another embodiment of this invention.
Figure 14:
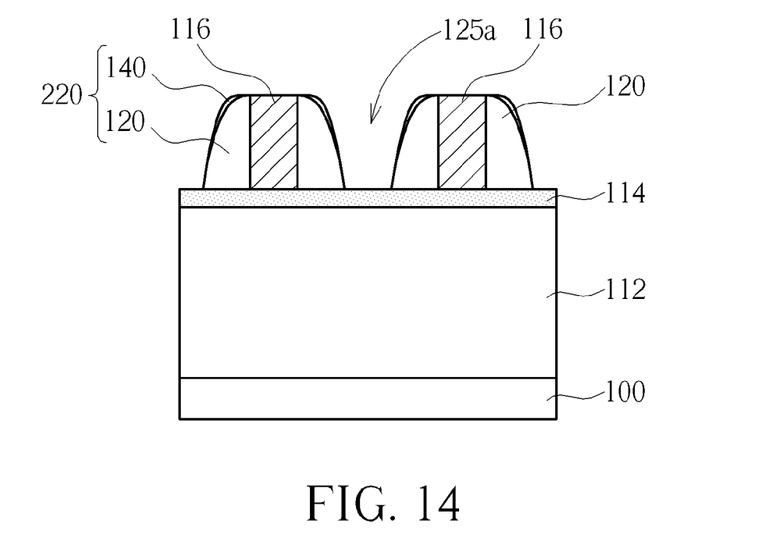
Figure 15:
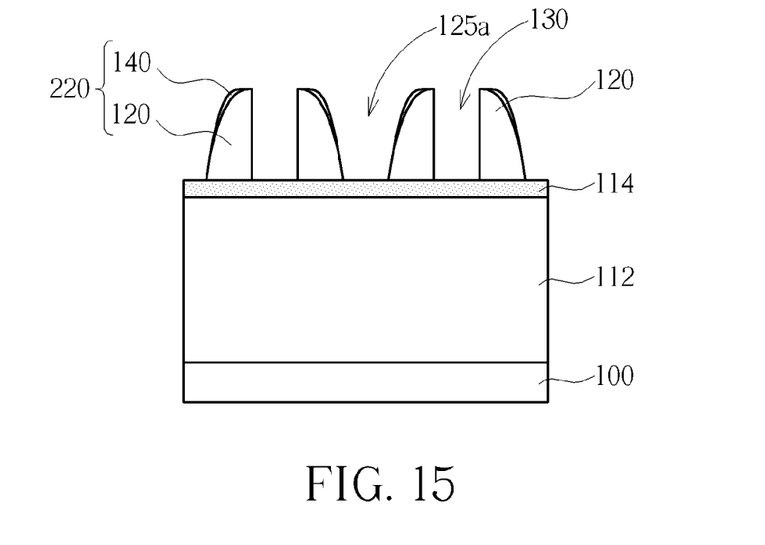
Figure 16:
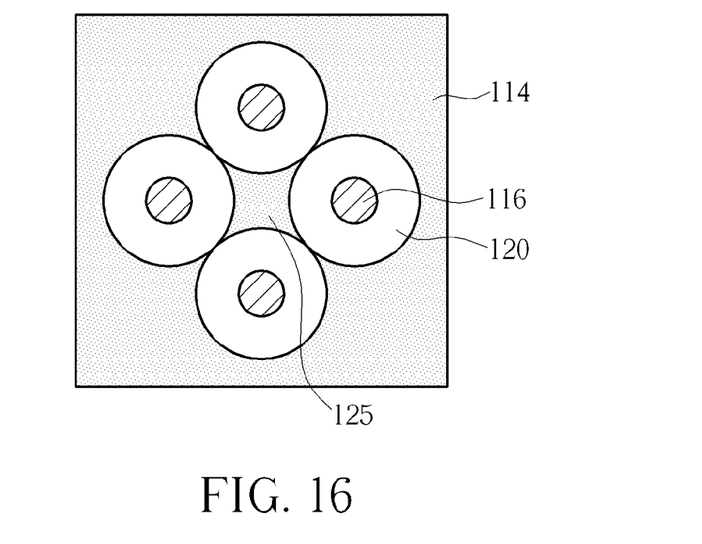
FIGS. 16-18 are top views of the elements shown in FIGS. 13-15.

Alternatively, the second ALD and etch step may be carried out before stripping the hard mask pillars. FIGS. 13-15 are schematic, cross-sectional diagrams showing a self-aligned method for patterning densely packed contact holes in a DRAM array in accordance with another embodiment of this invention, wherein like numeral numbers designate like layers, regions or elements. As shown in FIG. 13, likewise, after the formation of the hard mask pillars 116, an annual spacer 120 is formed around each of the hard mask pillars 116. FIG. 16 shows the top view of the annual spacers 120 and the hard mask pillars 116. The contiguous spacers 120 between four adjacent hard mask pillars 116 define a hole pattern 125 with an asteriated shape when viewed from above.

Figure 17:
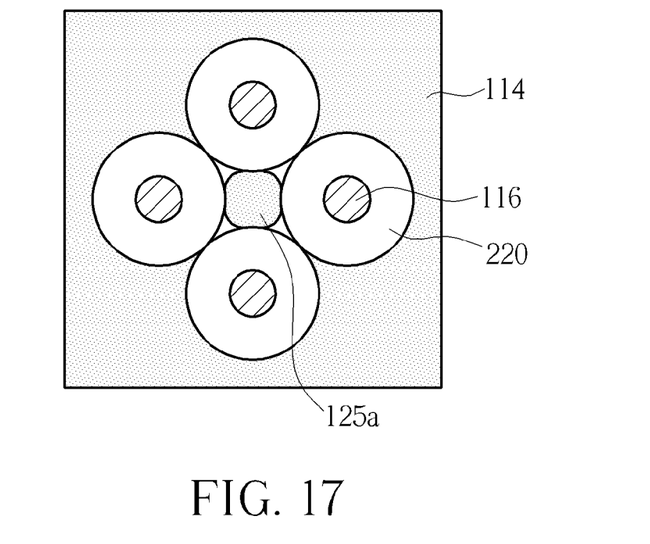
Figure 18:
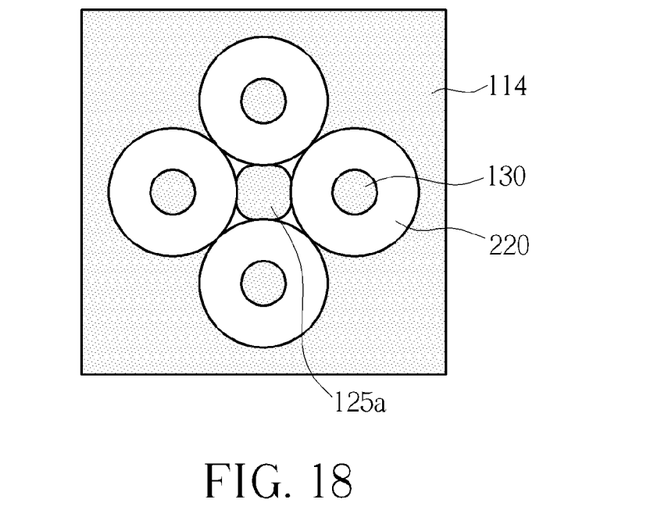

As shown in FIG. 14 and FIG. 17, a second ALD process is carried out to deposit a conformal thin oxide layer (not shown) on the spacers 120, the top surface of each of the hard mask pillars 116 and on the DARC layer 114. The conformal thin oxide layer doest not fill the hole patterns 125. An anisotropic dry etching process is then performed to etch the conformal thin oxide layer. As shown in FIG. 17, by performing the second ALD and etching, the hole pattern 125 becomes rounder and smoother. After the second ALD and etching, a small part of the conformal thin oxide layer 140 may remain on the spacer 120, which constitute a spacer pattern 220. A small part of the conformal thin oxide layer 140 may be inlaid into the hole pattern 125 thereby forming a rounded hole pattern 125a. As shown in FIG. 15 and FIG. 18, after the second ALD and etching process, the hard mask pillars are selectively removed to form hole pattern 130. Subsequently, the hole pattern 130 and the hole pattern 125a may be transferred into the underlying carbon layer 112 as set forth in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hard mask spacer structure, comprising:
   a plurality of annular-shaped spacers on a device layer, the plurality of annular-shaped spacers are in contiguous with one another, thereby defining a lattice-shaped hole pattern including a plurality of hole patterns each of which surrounded by each of the plurality of annular-shaped spacers, and asteriated hole patterns between the plurality of annular-shaped spacers; and
   a material layer inlaid into the asteriated hole patterns, thereby rounding the asteriated hole pattern, wherein the material layer does not fill the asteriated hole pattern.

2. The hard mask spacer structure according to claim 1 wherein each of the plurality of annular-shaped spacers surrounds a hard mask pillar.

3. The hard mask spacer structure according to claim 2 wherein the hard mask pillar comprises polysilicon or silicon nitride.

4. The hard mask spacer structure according to claim 1 wherein each of the plurality of annular-shaped spacers comprises silicon oxide.

5. The hard mask spacer structure according to claim 1 wherein the material layer comprises silicon oxide.

6. The hard mask spacer structure according to claim 1 wherein a carbon layer is disposed between the device layer and the first spacer.

7. The hard mask spacer structure according to claim 1 wherein a dielectric anti-reflection coating (DARC) layer is disposed on the carbon layer.

* * * * *